United States Patent
Kishi et al.

(10) Patent No.: US 10,290,677 B2
(45) Date of Patent: *May 14, 2019

(54) SEMICONDUCTOR DEVICE HAVING HALL ELEMENTS FORMED IN A SEMICONDUCTOR SUBSTRATE AND A MAGNETIC BODY FLUX CONCENTRATOR

(71) Applicant: SII Semicondutor Corporation, Chiba-shi, Chiba (JP)

(72) Inventors: Matsuo Kishi, Chiba (JP); Miei Takahama (nee Sato), Chiba (JP); Hiroshi Takahashi, Chiba (JP); Mika Ebihara, Chiba (JP); Takaaki Hioka, Chiba (JP)

(73) Assignee: ABLIC Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/457,290

(22) Filed: Mar. 13, 2017

(65) Prior Publication Data

US 2017/0271400 A1 Sep. 21, 2017

(30) Foreign Application Priority Data

Mar. 15, 2016 (JP) .................... 2016-051494

(51) Int. Cl.
| | |
|---|---|
| *H01L 27/22* | (2006.01) |
| *G01R 33/07* | (2006.01) |
| *H01L 43/04* | (2006.01) |
| *H01L 43/06* | (2006.01) |
| *H01L 43/14* | (2006.01) |

(52) U.S. Cl.
CPC .............. *H01L 27/22* (2013.01); *G01R 33/07* (2013.01); *H01L 43/04* (2013.01); *H01L 43/06* (2013.01); *H01L 43/14* (2013.01)

(58) Field of Classification Search
CPC .......... H01L 27/22; H01L 43/06; H01L 43/14
See application file for complete search history.

(56) References Cited

U.S. PATENT DOCUMENTS

| | | | |
|---|---|---|---|
| 8,664,943 B2* | 3/2014 | Okada | G01D 5/145 324/207.11 |
| 2017/0271401 A1* | 9/2017 | Kishi | G01R 33/07 |

OTHER PUBLICATIONS

Abstract, Publication No. JP 2002-071381, Publication date Mar. 8, 2002.
Abstract, Publication No. WO 2007-119569, Publication date Oct. 25, 2007.
Abstract, Publication No. JP 2008-055663, Publication date Mar. 13, 2008.

* cited by examiner

*Primary Examiner* — Quoc D Hoang
(74) *Attorney, Agent, or Firm* — Adams & Wilks

(57) ABSTRACT

A semiconductor device includes a semiconductor substrate having a plurality of Hall elements formed therein, and a magnetic body formed on the semiconductor substrate and having a magnetic flux converging function. The contour in vertical cross-section of the magnetic body on the semiconductor substrate has an outer circumferential portion. At least a part of the outer circumferential portion has a portion having an approximate quadrant shape, and a portion contiguous to the approximate quadrant portion and substantially parallel to the semiconductor substrate.

5 Claims, 6 Drawing Sheets (a)

(b)

SEMICONDUCTOR DEVICE HAVING HALL ELEMENTS FORMED IN A SEMICONDUCTOR SUBSTRATE AND A MAGNETIC BODY FLUX CONCENTRATOR

BACKGROUND OF THE INVENTION

1. Field of the Invention

The present invention relates to a semiconductor device configured to detect magnetism, and a method of manufacturing the semiconductor device. More particularly, the present invention relates to a semiconductor device capable of detecting magnetism in two-dimensional or three-dimensional directions with high sensitivity by including a plurality of Hall elements and a magnetic body that is configured to converge magnetic fluxes passing near the semiconductor device, and to a method of manufacturing the semiconductor device.

2. Description of the Related Art

Semiconductor devices configured to detect magnetism by the Hall effect have been known for years, and semiconductor devices that combine a Hall element with a magnetic body have also been made in order to enhance sensitivity and performance and detect magnetism in two-dimensional or three-dimensional directions.

For instance, in a magnetic field direction sensor utilizing the Hall effect that is described in Japanese Patent Application Laid-open No. 2002-71381, a plurality of Hall elements are arranged and a magnetic flux converging plate having a flat shape and made from a soft-magnetic material is arranged above a region of the plurality of Hall elements.

In the magnetic field direction sensor, an edge portion of the magnetic flux converging plate is located in the Hall element region, and magnetic fluxes converged by the magnetic flux converging plate accordingly concentrate in a direction perpendicular to the Hall elements in the vicinity of surfaces of the Hall elements. This makes the density of magnetic fluxes passing the Hall elements high, thereby enhancing the sensitivity of detecting the magnetic fluxes. This further enables the magnetic field direction sensor to calculate magnetic flux directions and the magnetic flux intensity in each magnetic flux direction by detecting and calculating for each of the plurality of Hall elements the intensity of a magnetic flux that passes the Hall element. A magnetic flux direction relative to the magnetic field direction sensor can thus be broken into coordinate axes that have the magnetic field direction sensor as the reference. A marked improvement in performance from a magnetic sensor that simply uses a Hall element can be expected as a result.

A magnetic sensor utilizing the Hall effect that is described in International Patent WO2007/119569 is based on a structure and principle similar to those of Japanese Patent Application Laid-open No. 2002-71381. Stress generated between the magnetic flux converging plate and a semiconductor substrate on which the magnetic flux converging plate is mounted due to the difference in material, in particular, stress due to the difference in thermal expansion influences sensor characteristics significantly. The magnetic sensor therefore has a structure for reducing the influence.

The magnetic sensor achieves this goal by employing a structure in which a base layer is formed between the magnetic flux converging plate and the semiconductor substrate, a portion of the base layer that is connected to the semiconductor substrate is smaller in area than the magnetic flux converging plate, and the base layer at least partially covers the Hall element region.

The magnetic sensor utilizing the Hall effect that is described in International Patent WO2007/119569 also regulates the shape in vertical cross-section of the magnetic flux converging plate, to thereby improve its performance.

FIG. 6A to FIG. 6C are diagrams for illustrating, as a magnetic sensor of the related art, the magnetic sensor that is described in International Patent WO 2007/119569. A main portion of the magnetic sensor is illustrated in vertical cross-section in FIG. 6A to FIG. 6C.

In the magnetic sensor illustrated in FIG. 6A, the base layer is smaller in area than the magnetic flux converging plate. Hall elements 102a and 102b are formed and embedded near one surface of a semiconductor substrate 101a. An insulating protective layer 103 is formed on surfaces of the Hall elements 102a and 102b. A base layer 104 is formed on a surface of the insulating protective layer 103 so as to cover the Hall elements 102a and 102b. A magnetic flux converging plate 105a is further formed on top of the base layer 104 from a magnetic material so as to be larger in area than the base layer 104.

Structures illustrated in FIG. 6B and FIG. 6C are tapered in a straight line in end surface directions of magnetic flux converging plates 105b and 105c.

When the base layer or the magnetic flux converging plate is directly arranged on the Hall element region, stress is generated on the Hall element region, which is undesirable. Formation of the base layer, the magnetic flux converging plate, or other similar structures on the Hall element region should thus be avoided for the improvement of element performance as well.

In addition, the tapered structures of FIG. 6B and FIG. 6C do not exactly have a curvature that is preferred in order to converge magnetic fluxes efficiently and vertically to the Hall element region surface, which is formed in a direction parallel to the semiconductor substrate (planar direction). In a structure having the preferred curvature, an end surface of the magnetic flux converging plate faces the direction of the Hall elements, and a magnetic flux passing through a portion of the magnetic flux converging plate that is parallel to the semiconductor substrate is efficiently deflected in a direction perpendicular to the semiconductor substrate.

A magnetic sensor that includes a magnetic flux converging plate is fabricated by, as described in International Patent WO2007/119569 and Japanese Patent Application Laid-open No. 2008-55663, photolithography, vapor plating, and electrolytic plating. Shape regulation using a mold for electrolytic plating with a photoresist is employed as a method of forming the magnetic flux converging plates 105b and 105c, which are tapered in a straight line.

Another known method combines photolithography and electrolytic plating to form a plated object that has an approximate quadrant shape (see Japanese Patent Application Laid-open No. 2008-55663, for example).

According to this method, a structure having a curved surface that has an approximate quadrant shape in section can be formed by electrolytic plating.

It is not preferred to mount a base layer, a magnetic flux converging plate, or other similar structures on the Hall element region as described above, and there has been no effective measure to form a magnetic flux converging plate right above the Hall element region without forming a structure directly on the Hall element region.

There has also been a demand for a magnetic flux converging plate that has a more suitable structure for deflecting a magnetic flux vertically to the Hall element region, and for a method of manufacturing the magnetic flux converging plate.

SUMMARY OF THE INVENTION

The present invention has been made in view of the circumstances described above to provide a semiconductor device that includes a magnetic sensor installed with a Hall element that has a minute structure made by a semiconductor manufacturing technology and with a magnetic flux converging plate that has an end surface structure through which a magnetic flux can pass efficiently and vertically to a surface of the Hall element region, and a method of manufacturing the semiconductor device.

The present invention employs the following measures.

According to one embodiment of the present invention, there is provided a semiconductor device, comprising:

a semiconductor substrate having a plurality of Hall elements formed therein; and a magnetic body formed on the semiconductor substrate with a protective layer interposed between the magnetic body and the semiconductor substrate, the magnetic body having a magnetic flux converging function, and the magnetic body having a contour having an outer circumferential portion in vertical cross-section, at least a part of the outer circumferential portion comprising a curve-shaped portion and a portion continuous from the curve-shaped portion and substantially parallel to the semiconductor substrate, and a gap being formed between the substantially parallel portion and the protective layer.

Further, according to one embodiment of the present invention, there is provided a method of manufacturing a semiconductor device, comprising:

forming a plurality of Hall elements on a surface of a semiconductor substrate;

forming a protective layer from an insulator on the plurality of Hall elements;

forming a conductive film;

forming a plating resist layer having an opening in a manner that prevents the opening from overlapping with a Hall element region; and growing a magnetic body by wet plating from resist edge portions above the opening of the plating resist layer isotropically in a direction perpendicular to the resist and in a direction parallel to the resist, the magnetic body having a magnetic flux converging function.

According to the present invention, the semiconductor device that is installed with a magnetic flux converging plate configured to detect magnetism in two-dimensional or three-dimensional directions with high sensitivity can be provided.

BRIEF DESCRIPTION OF THE DRAWINGS

FIG. 1A is a top view of the main portion, and FIG. 1B is a sectional view taken along the line A-A' of FIG. 1A.

FIG. 2A is a diagram of a step of forming a protective layer, FIG. 2B is a diagram of a step of forming a conductive film, and FIG. 2C and FIG. 2D are each a vertical cross-sectional view for illustrating a step of forming a plating resist layer.

DESCRIPTION OF THE EMBODIMENTS

A first embodiment of the present invention is described with reference to FIG. 1A to FIG. 5B.

Figure 1A:
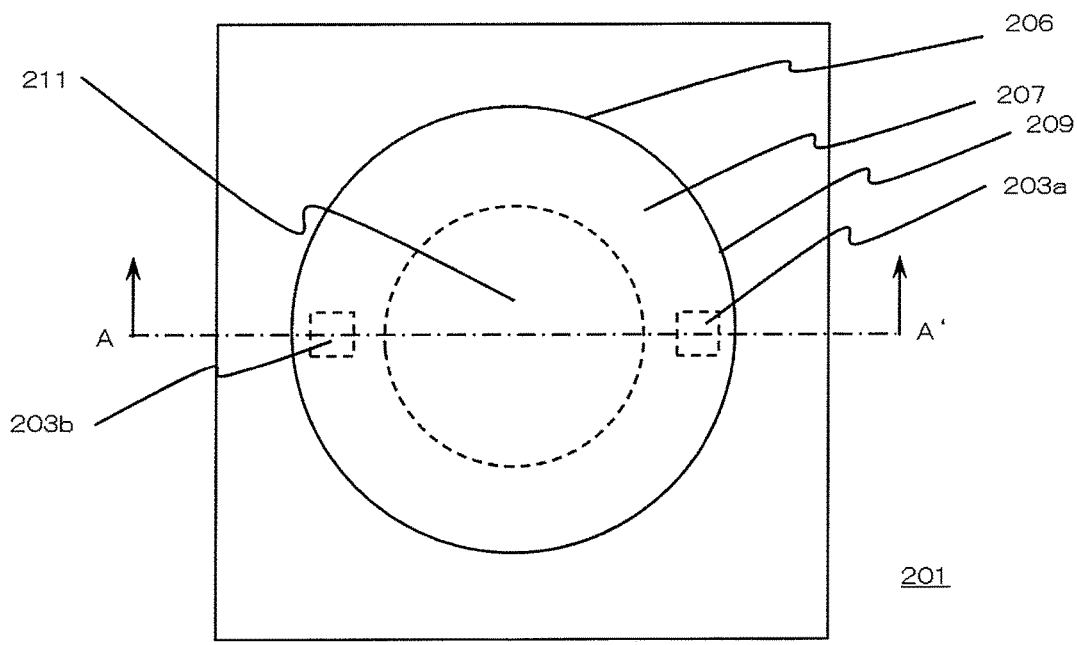
FIG. 1A and FIG. 1B are diagrams for illustrating a main portion of a semiconductor device according to an embodiment of the present invention.
Figure 1B:
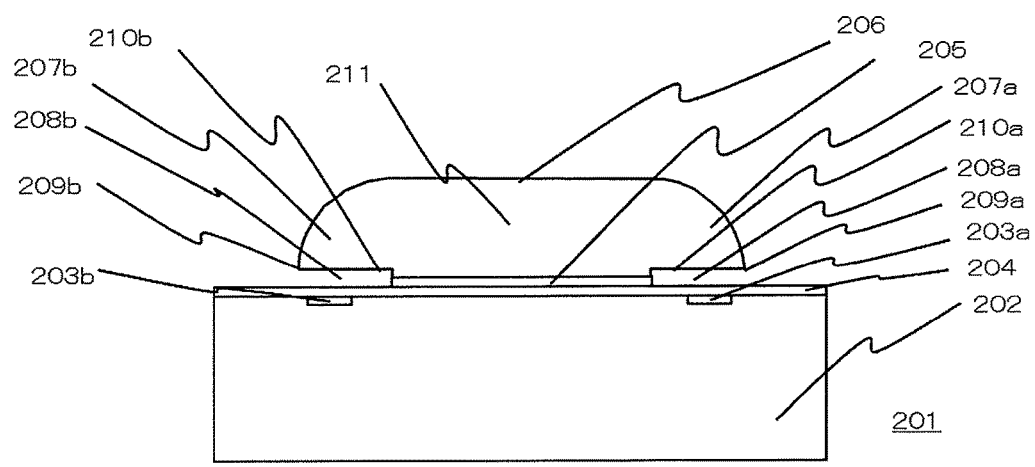

FIG. 1A is a schematic top view of a surface of a semiconductor device according to the present invention. FIG. 1B is a schematic vertical cross-sectional view taken along the line A-A' of FIG. 1A.

A semiconductor device 201 includes two Hall elements 203a and 203b, an insulating protective layer 204, a base layer 205, and a magnetic body 206. The Hall elements 203a and 203b are formed at a distance from each other on a surface of a semiconductor substrate 202, which is a silicon substrate. The insulating protective layer 204 covers the top of the semiconductor substrate 202. The base layer 205 is formed on a portion of the insulating protective layer 204 that is between the Hall elements 203a and 203b to avoid a contact with the Hall elements 203a and 203b. The magnetic body 206 is formed on the base layer 205, and is made up of a columnar portion 211 and overhang portions 207, 207a, and 207b, which are formed around the columnar portion 211. As illustrated in FIG. 1A, the overhang portion 207 is formed around the columnar portion 211 in a donut shape in plan view. The overhang portions 207a and 207b in sectional view each have a curved surface that is shaped approximately like a quadrant as illustrated in FIG. 1B. Bottom portions 210a and 210b of the overhang portion are parallel to the insulating protective film 204 across gaps 208a and 208b till edge portions 209a and 209b.

The edge portions 209a and 209b of the overhang portion jut out so as to cover the Hall elements 203a and 203b with the gaps 208a and 208b interposed therebetween. The outer circumference of the magnetic body 206 is thus substantially determined by the columnar portion 211 and the overhang portion 207. The gaps 208a and 208b enable the base layer 205 to avoid a contact with the Hall elements 203a and 203b when formed. The resultant structure keeps the Hall elements 203a and 203b from receiving stress directly from the base layer 205 and the magnetic body 206.

The bottom portions 210a and 210b, which are a part of the magnetic body 206, and the Hall elements 203a and 203b face each other across the gaps 208a and 208b in parallel to each other. This arrangement causes magnetic fluxes that are converged to the magnetic body 206 and that pass through the bottom portions 210a and 210b to enter and exit the Hall elements 203a and 203b vertically, thereby enabling the Hall elements 203a and 203b to exert the Hall effect with efficiency.

Manufacturing steps for fabricating this semiconductor device 201 are described next with reference to FIG. 2A to FIG. 4B, which are vertical cross-sectional views of a main portion of the semiconductor device 201.

Figure 2A:
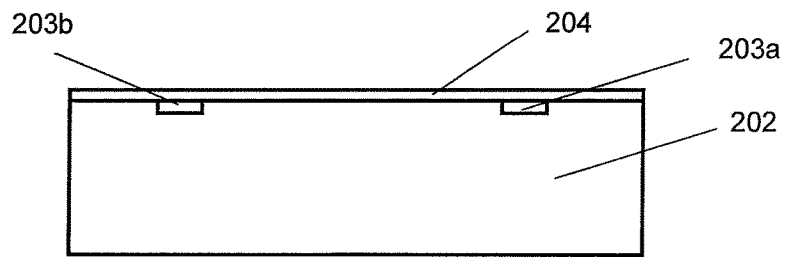
FIG. 2A, FIG. 2B, FIG. 2C, and FIG. 2D are diagrams for illustrating manufacturing steps of the semiconductor device according to the embodiment of the present invention.

First, the semiconductor substrate 202 is prepared through a step of forming and embedding two Hall elements 203a and 203b near a surface of a silicon semiconductor substrate by a silicon semiconductor manufacturing process (not shown). The Hall elements 203a and 203b are each a rectangle that measures 30 μm on a side. The protective layer 204 is formed from an insulator on the surface of the semiconductor substrate 202 (FIG. 2A). The protective layer 204 can be a single insulating inorganic compound film such as an oxide film, a nitride film, or an oxynitride film, or a single organic film such as a polyimide film, or a combination of the films given here as an example. The protective layer 204 in this embodiment uses a polyimide film as the topmost layer.

Figure 2B:
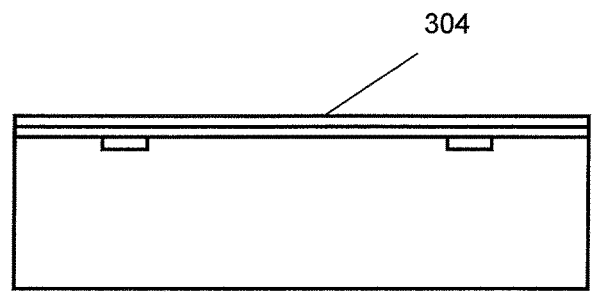

FIG. 2B is a diagram for illustrating a step of forming a conductive film 304 on a surface of the protective layer 204 which is formed on the surface of the semiconductor substrate 202. The conductive film 304 here is a copper film formed by sputtering to a thickness of 500 nm.

Figure 2C:
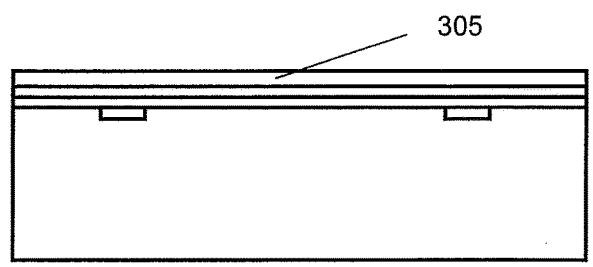
Figure 2D:
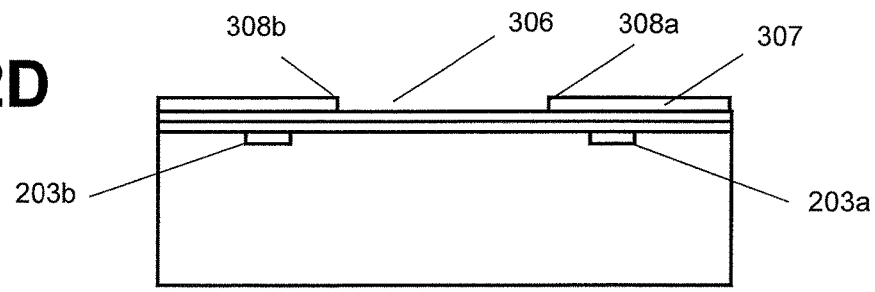

FIG. 2C and FIG. 2D are diagrams for illustrating a step of forming a plating resist layer. In this step, a surface of the conductive film 304, which is a part of the current surface of the semiconductor substrate 202, is coated with a photoresist 305 (FIG. 2C), and a plating resist layer 307 having a resist opening 306 is formed by exposure and development (FIG. 2D). The photoresist 305 can be a positive photoresist and a negative photoresist both, and can be a dry film photoresist or other film photoresists instead of a liquid photoresist. In this embodiment, the conductive film 304 is coated with a liquid positive photoresist with the use of a spin coater until the coat reaches a thickness of 3 μm. The resist opening 306 is formed so that the distance between a resist edge portion 308a and the Hall element 203a and the distance between a resist edge portion 308b and the Hall element 203b are each 5 μm on the resist opening 306 side.

Figure 3A:
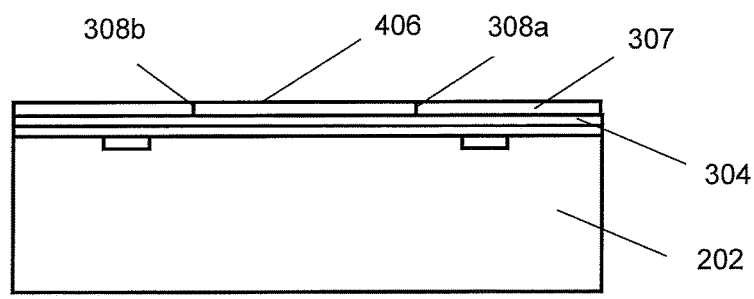
FIG. 3A, FIG. 3B, and FIG. 3C are vertical cross-sectional views for illustrating the process of forming a magnetic plating deposit in order as a part of manufacturing steps of the semiconductor device according to the embodiment of the present invention.
Figure 3B:
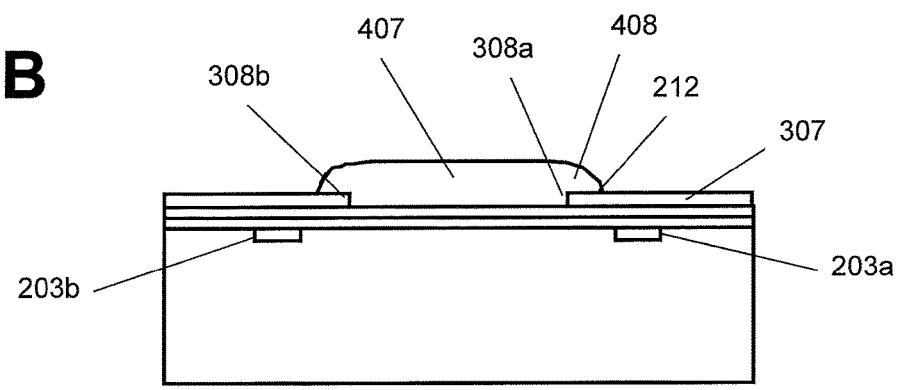
Figure 3C:
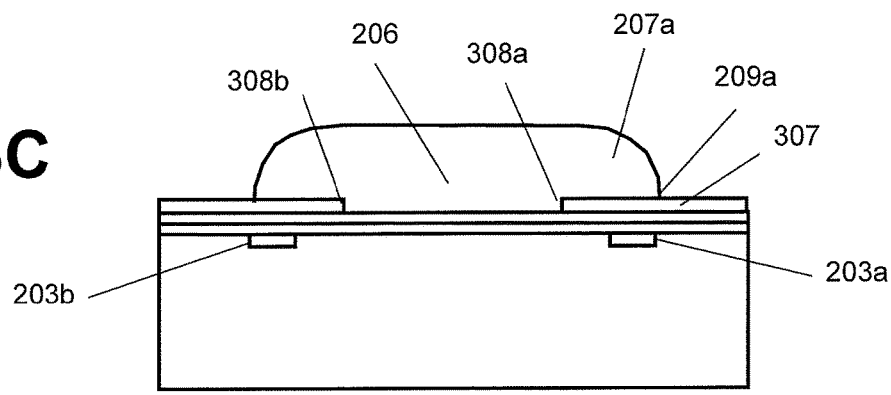

FIG. 3A to FIG. 3C are diagrams for illustrating a magnetic body plating step. FIG. 3A is a diagram for illustrating the process of forming a magnetic plating deposit 406 inside the resist opening 306 of FIG. 2D. FIG. 3B is a diagram for outlining how a magnetic body 407 reaches the resist edge portions 308a and 308b of FIG. 2D to form a growth portion 408, which is isotropic in a longitudinal direction and in a direction running along a surface of the resist layer 307. FIG. 3C is a diagram for illustrating a mode of the magnetic body 206, which has reached a desired growth amount. It can be said that the shape of the magnetic body 206 is made up of the columnar portion 211, which is grown to a space above the resist opening 306, and the overhang portions 207a and 207b, which surround the columnar portion 211. An outer circumferential portion that is the contour of the magnetic body 206 in vertical cross-section is also substantially determined by the columnar portion 211 and the overhang portions 207a and 20b surrounding the columnar portion 211.

A plating method for the magnetic body 206 that is formed in this manner is described. The magnetic body plating solution used here contains nickel sulfamate in a metal concentration of 50 g/l and ferrous sulfamate in a metal concentration of 5 g/l, also contains boric acid as a pH adjuster, and further contains a water-soluble organic material as a brightening agent. An electric current is applied to this plating solution to deposit an alloy of nickel and iron that contains 20 wt % of iron on a portion of the conductive film 304 that is exposed in the resist opening 306 in FIG. 2D. The iron content can be controlled by the ratio of the nickel ion concentration and the ferrous ion concentration in the plating solution, and by the value of the electric current density during electroplating. In this embodiment, each ion concentration is kept constant, and the composition of the magnetic plating deposit is thus stabilized by changing the electric current value to suit the area of the plated region and thus keeping the electric current density constant.

Specifically, a plating deposition rate V, which is in proportion to the electric current density, is constant when the electric current density is kept constant. For example, the optimum condition for the relationship between the plating solution and the deposit in this embodiment is to set the electric current density to 20 mA/cm². The rate V at which the plating deposit grows in this case is approximately 0.4 μm/min. When the electric current density is given as $I_d$ and a proportionality coefficient obtained based on elements that are constituents of the plating deposit is given as k, V satisfies a relationship of $I_d \times k$. In the case of a nickel-iron alloy plating deposit that has the composition of this embodiment, for example, V is approximately 0.4 μm/min when $I_d$ is 20 mA/cm², and the coefficient k is thus calculated as 0.02 μm/mA/min.

In FIG. 3A, the magnetic plating deposit 406 is formed to a thickness of 3 μm, which is the thickness of the resist layer 307, at an electric current density of 20 mA/cm² and at a constant electric current value suited to the area of the resist opening 306. The time required for this plating is calculated as 7.5 minutes by 3/0. 4. When the thickness of the resist layer 307 is given as $Y_1$ and the time that the magnetic plating deposit 406 takes to reach the thickness $Y_1$ is given as $t_1$, a general formula is expressed as follows:

$$t_1 = Y_1/V = Y_1/(I_d \times k).$$

When the resist opening 306 is a circle having a radius r and the area thereof is given as $S_1$, which satisfies $S_1 = \pi \times r^2$, an electric current value $I_1$ in this case is expressed as follows:

$$I_1 = I_d \times S_1 = I_d \times \pi \times r^2.$$

The magnetic plating deposit 406 grows further and reaches the resist edge portions 308a and 308b. From the resist edge portions 308a and 308b, the magnetic plating deposit 406 starts growing in an isotropic manner in a longitudinal direction (a direction perpendicular to the resist) and in a lateral direction (the direction of the resist plane), and turns into the magnetic body 407, which is larger than the resist opening 306 (FIG. 3B).

The surface area of the magnetic body 407 at this point is the sum of the area of the resist opening 306 and the surface area of approximate quadrant portions grown from the resist edge portions 308a and 308b. In this embodiment, where the plating resist opening 306 is circular, a surface area $S_2$ of the approximate quadrant portions are calculated from a time t, which represents the length of time passed since the start of the plating, a time $t_2$, which represents the length of time passed since the plating deposit grows past the resist layer 307 and which is expressed as $t-t_1$, and a thickness $Y_2$, which represents the thickness of the plating deposit that is formed in the time $t_2$ and which is equivalent to the radius of the approximate quadrant portions, as follows:

$$S_2 = (2 \times \Pi \times Y_2/4) \times (2 \times \Pi \times r)$$
$$= \Pi^2 \times Y_2 \times r$$
$$= \Pi^2 \times V \times t_2 \times r$$

$$= \Pi^2 \times k \times I_d \times t_2 \times r$$
$$= \Pi^2 \times k \times I_d \times (t - t_1) \times r.$$

The total surface area S is given by the sum of $S_2$ and the area $S_1$ of the resist opening 306 and is expressed as follows:

$$S = S_1 + S_2 = \pi \times r^2 + \pi n^2 \times k \times I_d \times (t-t_1) \times r.$$

An electric current value I(t) in this case is expressed as follows:

$$I(t) = S \times I_d = I_d \times (\pi \times r^2 + \pi^2 \times k \times I_d \times (t-t_1) \times r).$$

Electric current settings for forming the magnetic body 206 of this embodiment that is illustrated in FIG. 3C at a constant growth rate are specifically set as described below. When the number of magnetic bodies 206 to be formed is given as N, the electric current value is set to $N \times I_d \times \pi \times r^2$ from a time 0 till the thickness $Y_1$ of the resist layer 307 is reached, i.e., till the time $t_1$. Thereafter, the electric current value is changed until a magnetic body 206 having a desired size is obtained, while maintaining a relationship of $I(t) = N \times I_d \times (\pi \times r^2 + \pi^2 \times k \times I_d \times (t-t_1) \times r)$.

Completion of the plating is determined by the amount of growth of the plating deposit, namely, the resist thickness and the distance from the resist edge portions 308a and 308b to the plating deposit edge portions 209a and 209b. The distance from the resist edge portion 308a to the plating deposit edge portion 209a is equal to a value that is calculated by multiplying the plating rate V by the time $t_2$, which represents the time when the plating deposit starts growing from the resist edge portions 308a and 308b and which is expressed as $t-t_1$. When this distance is given as X, X is thereby expressed as $V \times t_2 = V \times (t-t_1)$. The plating completion time t is accordingly expressed as follows:

$$t = t_1 + t_2 = Y_1/(I_d \times k) + X/V = Y_1/(I_d \times k) + X/(I_d \times k).$$

In this embodiment, the plating deposit edge portions 209a and 209b are set to 5 μm on the outside of the Hall elements 203a and 203b, and the distance X is accordingly calculated as 40 μm by (5+30+5). The plating time $t_2$ is calculated from $I_d$, which is 20 mA/cm², k, which is 0.02 μm/mA/min, and $t_1$, which is 7.5 minutes, to give 107.5 minutes by 40/(20×0.02)+7.5.

The magnetic body 206 was formed under plating conditions set as described above. The resultant magnetic body 206 has an ideal shape that has approximate quadrant portions, and has a composition in which the nickel content is 80 wt % and the iron content is 20 wt %.

Figure 4A:
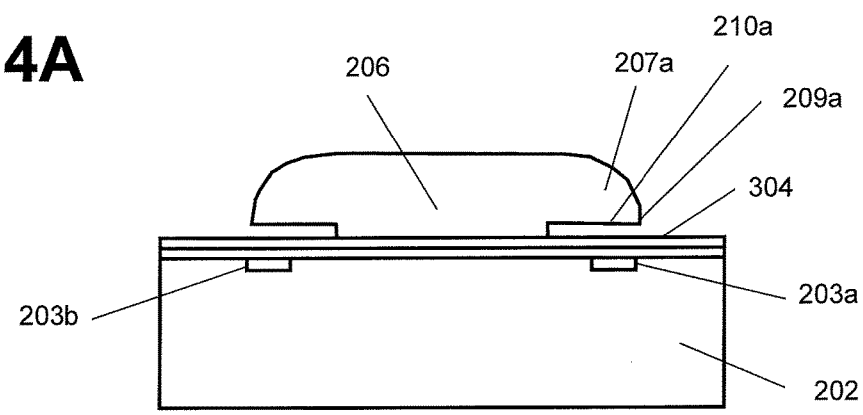
FIG. 4A and FIG. 4B are vertical cross-sectional views for illustrating a resist layer peeling step and an etching step, respectively, out of manufacturing steps of the semiconductor device according to the embodiment of the present invention.
Figure 4B:
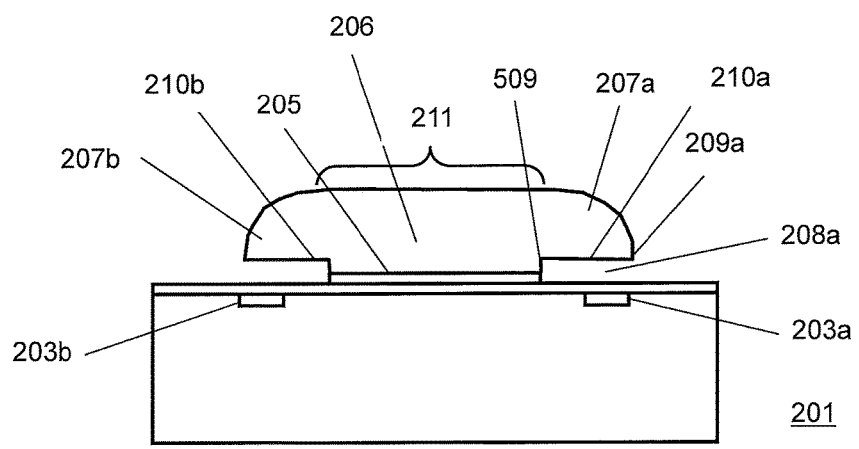

FIG. 4A and FIG. 4B are diagrams for illustrating a resist layer removing step (FIG. 4A) and a conductive film etching step (FIG. 4B).

In the resist layer removing step of FIG. 4A, the resist layer 307 formed of a positive photoresist is removed by a special peeling solution, and a gap of 3 μm, which is the thickness of the resist layer 307, is formed at this point between the bottom portion 210a of the overhang portion 207a of the magnetic body 206 and the conductive film 304 on a main body surface of the semiconductor substrate 202.

In the conductive film etching step of FIG. 4B, the gap formed in the resist layer removing step is utilized to remove, by wet etching, a portion of the conductive film 304 made of copper that is exposed on the main body surface of the semiconductor substrate 202. The wet etching solution used here is an aqueous ammonium persulfate solution having the pH adjusted to 12 or so by adding ammonia water. The gaps 208 are thus formed between the magnetic body 206 and the protective layer 204, which covers the Hall elements 203a and 203b formed in the surface of the semiconductor substrate 202. A portion of the conductive layer 304 that is left by the etching remains between the semiconductor substrate 202 and the magnetic body 206 as the base layer 205. In this way, the semiconductor device 201 is completed.

According to the embodiment of the manufacturing method described above, when the magnetic body film, which starts deposition and growth from the surface of the conductive film in the resist opening, fills the resist opening completely and reaches the height of the thickness of the resist, the magnetic body film then grows in the vertical direction in an area inside of the edge of the resist opening, and grows isotropically in an area outside of the resist edge in a direction perpendicular to the resist surface and in a direction parallel to the resist surface. The growth of an approximate quadrant shape centered on each resist edge starts in this portion, and this portion of the magnetic body film has an approximate quadrant shape in vertical cross-section when the growth is complete. The magnetic body film on the resist surface grows along the resist plane and has accordingly a surface parallel to the semiconductor substrate. As a result, a magnetic flux converging plate having a portion of an approximate quadrant in vertical cross-section with a surface that is parallel to the Hall element plane in the Hall element region can be formed.

The semiconductor device provided by the present invention is further capable of avoiding mounting a base film, a magnetic flux converging plate, or other similar structures directly on the Hall element region by peeling the plating resist layer and etching off the conductive film, having portions of the conductive film that are under the approximate quadrant portions of the magnetic flux converging plate.

The bottom portion 210a of the overhang portion 207a of the magnetic body 206 is parallel to the surface of the semiconductor substrate 202, and a perpendicular line dropped from the edge portion 209a of the overhang portion 207a of the magnetic body 206 hits a point that is outside one edge portion of the Hall element 203a by 5 μm. An inner edge portion 509 of the gap 208a is at a distance of 5 μm from the other edge portion of the Hall element 203a. This positional relationship ensures that the bottom portion 210a covers the Hall element 203a completely and in parallel to the Hall element 203a.

Figure 6A:
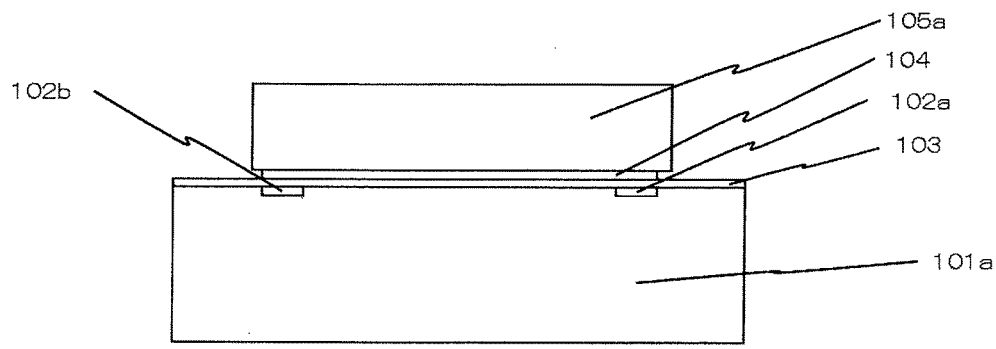
FIG. 6A, FIG. 6B, and FIG. 6C are vertical cross-sectional views for illustrating a main portion of a semiconductor device of the related art in which a magnetic body is installed.
Figure 6B:
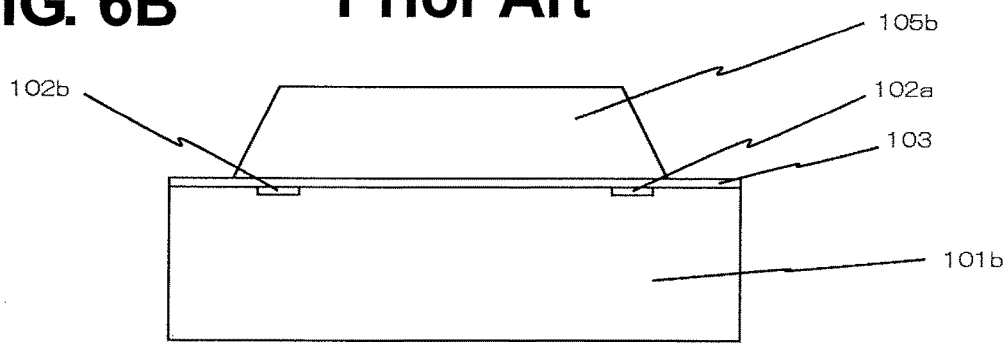
Figure 6C:
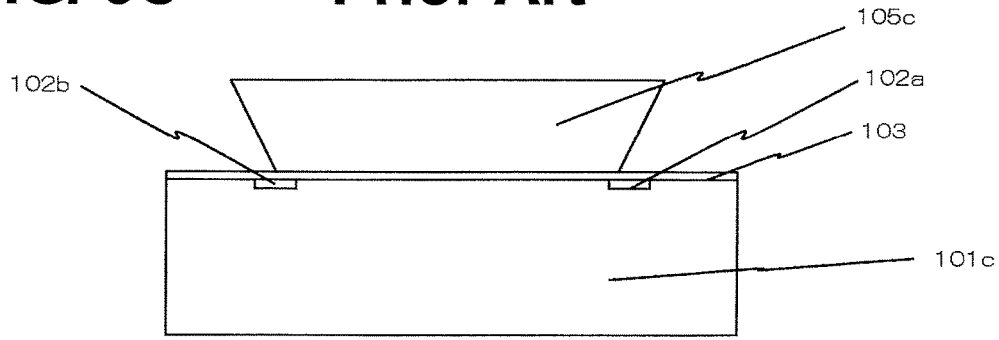

The thus fabricated semiconductor device 201 is installed with the magnetic body 206 shaped approximately like a letter U in vertical cross-section, which means that the semiconductor device is installed with Hall elements having excellent magnetic flux converging performance. Specifically, magnetic fluxes passing near the semiconductor device 201 are converged by the magnetic body 206, which contains 80 wt % of nickel and 20 wt % of iron and which has excellent magnetic flux converging performance, and pass through the bottom portions 210a and 210b, which are parallel to the Hall elements 203a and 203b because the approximate shape of the magnetic body 206 is close to the shape of a letter U. The magnetic fluxes consequently pass vertically to the Hall elements 203a and 203b. This enhances the Hall effect and makes the sensitivity of the Hall elements markedly higher than the one in a semiconductor device that has the structure of the related art illustrated in FIG. 6.

A magnetic field in a direction parallel to the semiconductor device 201, namely, a direction parallel to the Hall elements 203a and 203b, is deflected by the magnetic body 206, and the deflected magnetic flux enters and exits in a direction perpendicular to the Hall elements 203a and 203b. The direction of the entrance/exit is opposite in the Hall element 203a and in the Hall element 203b, which means that a magnetic field component in a direction parallel to the semiconductor device 201 can be calculated by calculating a difference between the output from the hall element 203a and the output from the Hall element 203b.

The magnetic flux in a direction perpendicular to the semiconductor device 201, namely, a direction perpendicular to the Hall elements 203a and 203b, passes through the magnetic body 206 without changing direction, and enters and exits the Hall elements 203a and 203b also without changing direction. The direction of the entrance and exit is the same in the Hall element 203a and in the Hall element 203b, which means that a magnetic field component in a direction perpendicular to the semiconductor device 201 can be calculated by calculating the sum of the output from the hall element 203a and the output from the Hall element 203b.

The semiconductor device according to this embodiment is installed with a magnetic body that has an inverted letter U shape convexing upward in vertical cross-section, and that has bottom portions forming bottom surfaces of overhang portions at the left and right edges of the inverted U-shape portion in parallel to the Hall elements and being located above the Hall elements. It is thus concluded from above that this semiconductor device is capable of dividing a magnetic field that is from outside the semiconductor device into a component parallel to the semiconductor device and a component perpendicular to the semiconductor device, and outputting the result with high sensitivity.

Figure 5A:
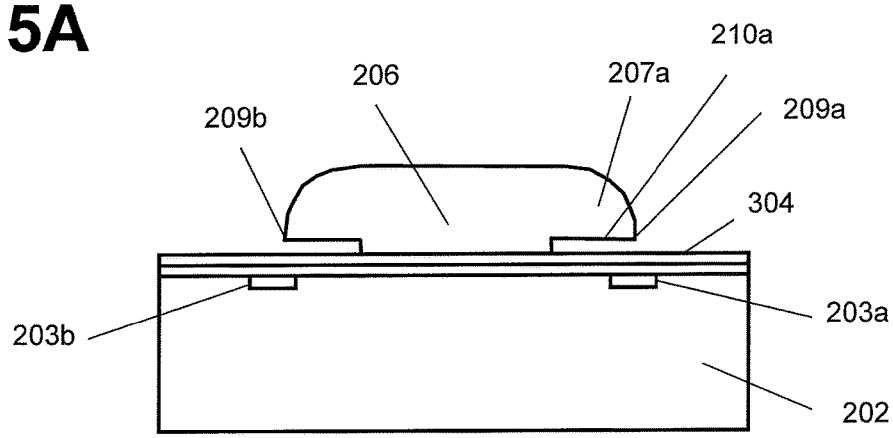
FIG. 5A and FIG. 5B are each a vertical cross-sectional view for illustrating another mode of the semiconductor device according to the embodiment of the present invention.

While the embodiment deals with an example in which the bottom portions on the inside of the edge portions of the inverted U shape illustrated in FIG. 1 cover the Hall elements completely, the edge portions 209a and 209b of the inverted U shape may partially overlap with the regions of the Hall elements 203a and 203b as illustrated in FIG. 5A.

Figure 5B:
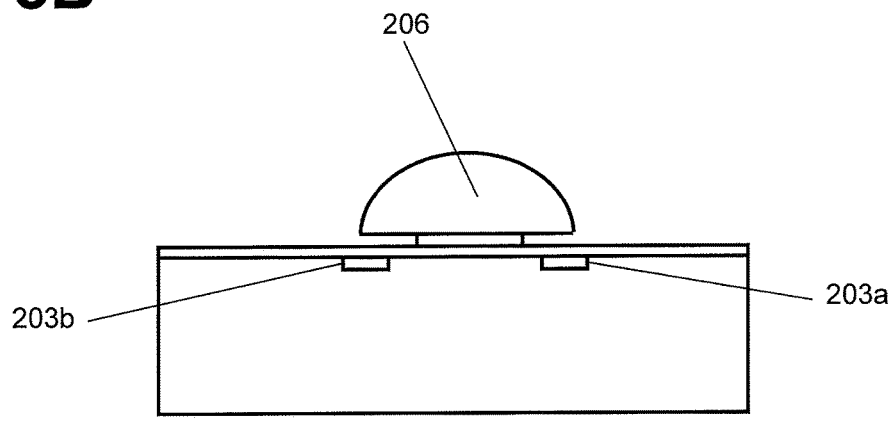

The same effect is obtained also when the overall shape of the magnetic plating deposit in vertical cross-section is approximately semi-circular or approximately semi-elliptic as illustrated in FIG. 5B. A magnetic body formed of a plating deposit that has this shape can be attained by appropriately setting the thickness of the resist layer 307 in FIG. 2D, the radius of the resist opening 306, and the positional relationship of the Hall elements 203a and 203b, and additionally changing the composition of the plating solution that is used to form the magnetic body 206. In particular, a desired shape is easily obtained because the ratio of longitudinal growth and lateral growth in the growth of an approximate quadrant plating deposit that is obtained through plating deposit growth isotropic in the longitudinal direction and the lateral direction can be changed by devising an organic-based additive that works.

The semiconductor device according to the present invention may be molded or sealed with resin or the like when installed or packaged. The gaps between the bottom portions of the magnetic body overhang portions and the Hall element surface may be filled with resin in this case. However, this does not affect the essence of the semiconductor device according to the present invention, and this mode is obviously included in the present invention.

What is claimed is:

1. A semiconductor device, comprising:
   a semiconductor substrate having a plurality of Hall elements formed therein; and
   a magnetic body formed on the semiconductor substrate with a protective layer interposed between the magnetic body and the semiconductor substrate, the magnetic body having a magnetic flux converging function, and the magnetic body having a contour having an outer circumferential portion in vertical cross-section,
   at least a part of the outer circumferential portion comprising a curve-shaped portion and a portion continuous from the curve-shaped portion and substantially parallel to the semiconductor substrate, and
   a gap being formed between the substantially parallel portion and the protective layer.

2. A semiconductor device according to claim 1, wherein the curve-shaped portion has an approximate quadrant shape.

3. A semiconductor device according to claim 2, wherein the approximate quadrant shape in vertical cross-section of the magnetic body has one terminal portion at which a tangential direction is substantially perpendicular to the semiconductor substrate.

4. A semiconductor device according to claim 2,
   wherein the semiconductor device has a portion parallel to the semiconductor substrate as a portion continuous from one terminal portion of the approximate quadrant shape, which is apart of the outer circumferential portion of the magnetic body in vertical cross-section, and
   wherein the parallel portion comprises a portion that at least partially covers a region of the plurality of Hall elements.

5. A semiconductor device according to claim 1, further comprising a base layer configured to connect the semiconductor substrate and the magnetic body to each other,
   wherein the base layer is kept from covering a region of the plurality of Hall elements.

* * * * *